(12) United States Patent
Yoon

(10) Patent No.: US 9,306,163 B2
(45) Date of Patent: Apr. 5, 2016

(54) ELECTRONIC DEVICE HAVING RESISTANCE ELEMENT

(71) Applicant: SK hynix Inc., Icheon-Si (KR)

(72) Inventor: Sung-Joon Yoon, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 37 days.

(21) Appl. No.: 14/195,729

(22) Filed: Mar. 3, 2014

(65) Prior Publication Data

US 2014/0247648 A1 Sep. 4, 2014

(30) Foreign Application Priority Data

Mar. 4, 2013 (KR) .................. 10-2013-0022761

(51) Int. Cl.
*H01L 45/00* (2006.01)
*G11C 13/00* (2006.01)
*H01L 43/08* (2006.01)

(52) U.S. Cl.
CPC ........ *H01L 45/1253* (2013.01); *G11C 13/0002* (2013.01); *G11C 2213/52* (2013.01); *H01L 43/08* (2013.01); *H01L 45/04* (2013.01)

(58) Field of Classification Search
USPC .................................. 365/148, 158
See application file for complete search history.

(56) References Cited

U.S. PATENT DOCUMENTS 5,901,018 A 5/1999 Fontana, Jr. et al.
7,307,874 B2 12/2007 Jeong et al.
8,792,271 B2 7/2014 Morise et al.

FOREIGN PATENT DOCUMENTS

KR 10-2011-0079827 A 7/2011
KR 10-2014-0108899 A 9/2014

OTHER PUBLICATIONS

Ozatay, O. et al., Spin Transfer by Nonuniform Current Injection into a Nanomagnet, Applied Physics Letters, 88:202502, 2006.

*Primary Examiner* — Huan Hoang
*Assistant Examiner* — Minh Dinh
(74) *Attorney, Agent, or Firm* — Perkins Coie LLP

(57) ABSTRACT

An electronic device includes a first electrode, a second electrode spaced apart from the first electrode, a resistance variable element interposed between the first electrode and the second electrode, and a conductor arranged at least one of a first side and a second side of the resistance variable element to apply an electric field to the resistance variable element while being spaced apart from the resistance variable element, the first side facing the second side.

19 Claims, 14 Drawing Sheets

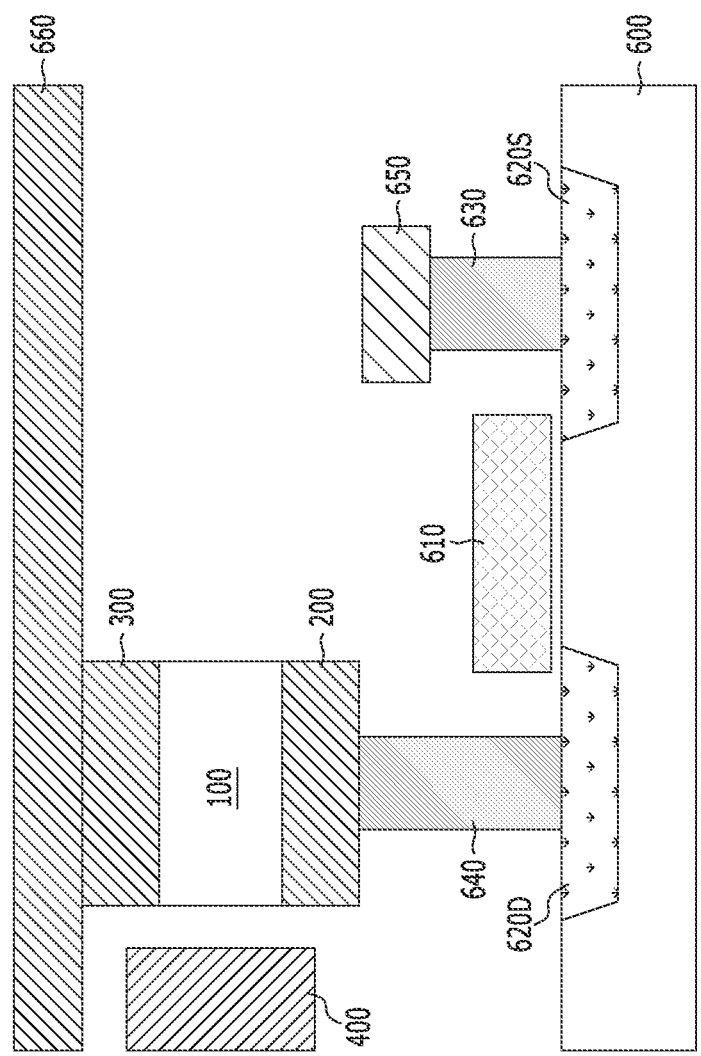

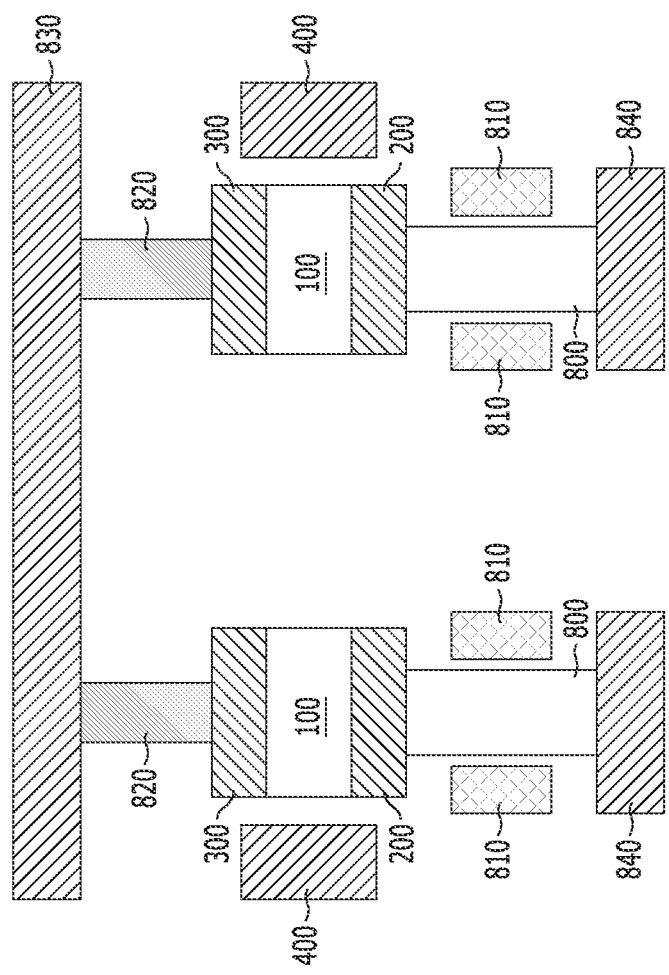

ELECTRONIC DEVICE HAVING RESISTANCE ELEMENT

CROSS-REFERENCE TO RELATED APPLICATIONS

The present application claims priority of Korean Patent Application No. 10-2013-0022761, entitled "SEMICONDUCTOR DEVICE, AND MICROPROCESSOR, PROCESSOR, SYSTEM, DATA STORAGE SYSTEM AND MEMORY SYSTEM INCLUDING THE SEMICONDUCTOR DEVICE," and filed on Mar. 4, 2013, which is incorporated herein by reference in its entirety.

TECHNICAL FIELD

This patent document relate to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which an electric field is applied to a resistance variable element through a conductor adjacent to the resistance variable element to allow a current to flow to a local area in the interior of the resistance variable element, so that a switching current of the resistance variable element is reduced, and an operation method thereof.

In one aspect, an electronic device including a semiconductor memory is provided and the semiconductor memory includes: a first electrode; a second electrode spaced apart from the first electrode; a resistance variable element interposed between the first electrode and the second electrode; and a conductor arranged at least one of a first side and a second side of the resistance variable element to apply an electric field to the resistance variable element while being spaced apart from the resistance variable element, the first side facing the second side.

In another aspect, an electronic device including a semiconductor memory is provided and the semiconductor memory includes: a first electrode; a second electrode spaced apart from the first electrode; a resistance variable element interposed between the first electrode and the second electrode; and a conductor arranged adjacent to the resistance variable element and providing an electric field to the resistance variable element.

In some implementations, the electric field may be generated in a direction crossing a direction of a current flowing through the resistance variable element.

In some implementations, the conductor may be electrically connected to the first or second electrode.

In some implementations, a voltage applied to the conductor may be equal to a voltage applied to the first or second electrode.

In some implementations, the conductor may include one or more of metal, metal nitride, and doped silicon.

In some implementations, the conductor may include a pair of conductors, and the resistance variable element is between one of the pair of conductors and the other of the pair of conductors.

In another aspect, an electronic device including a semiconductor memory is provided and the semiconductor memory includes: a first electrode; a second electrode; a resistance variable element interposed between the first electrode and the second electrode; and a pair of conductors arranged at opposite sides of the resistance variable element to apply an electric field to the resistance variable element.

In some implementations, the pair of conductors operate independently from each other.

In some implementations, different voltage is applied to each of the pair of conductors.

In some implementations, the pair of conductors may be electrically connected to the first electrode and the second electrode, respectively.

In some implementations, the pair of conductors may apply tensile stress or compressive stress to the resistance variable element.

In some implementations, the resistance variable element may include: a first magnetic layer; a second magnetic layer spaced apart from the first magnetic layer; a tunnel barrier layer formed between the first magnetic layer and the second magnetic layer.

In some implementations, the first or second magnetic layer may comprise: a lower ferromagnetic layer; an upper ferromagnetic layer spaced apart from the lower ferromagnetic layer; and a non-magnetic spacer layer formed between the lower ferromagnetic layer and the upper ferromagnetic layer.

In some implementations the electronic device may further include: an anti-ferromagnetic layer being in contact with the first or second magnetic layer.

In some implementations the resistance variable element may include a resistance variable layer and a switching layer.

In some implementations the resistance variable layer may include metal oxide or phase change material.

In some implementations, the conductor is arranged at a side of the resistance variable element and is spaced apart from the resistance element.

In some implementations the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory that includes the resistance variable element is part of the memory unit in the microprocessor.

In some implementations the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory that includes the resistance variable element is part of the cache memory unit in the processor.

In some implementations the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory that includes the resistance variable element is part of the auxiliary memory device or the main memory device in the processing system.

In some implementations the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory that includes the resistance variable element is part of the storage device or the temporary storage device in the data storage system.

In some implementations the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory that includes the resistance variable element is part of the memory or the buffer memory in the memory system.

In another aspect, a method for operating an electronic device having a variable resistance element is provided to include: providing two electrodes in contact with a variable resistance element to supply a current flows through the variable resistance element to change a resistance of the variable resistance element; and using one or more conductors adjacent to the variable resistance element to apply an electric field to the variable resistance element to reduce a spatial spread of the current inside the variable resistance element to reduce an amount of the current that is needed for causing the resistance of the variable resistance element to be changed.

In some implementations, the one or more conductors are separated from the two electrodes in contact with the variable resistance element.

In some implementations, one of the conductors is in electrical contact with one of the two electrodes in contact with the variable resistance element.

In some implementations, one conductor is in electrical contact with one of the two electrodes in contact with the variable resistance element and another conductor is in electrical contact with another one of the two electrodes in contact with the variable resistance element.

In some implementations, the variable resistance element includes: a pinned layer having a pinned magnetization direction; a free layer having a variable magnetization direction; and a tunnel barrier formed between the pinned layer and the free layer.

In some implementations, at least one of the pinned layer and the free layer is a synthetic anti-ferromagnetic (SAF) layer including a lower ferromagnetic layer, an upper ferromagnetic layer, and a non-magnetic spacer layer formed between the lower ferromagnetic layer and the upper ferromagnetic layer, and a thickness of the non-magnetic spacer layer changes to control exchange coupling characteristics between the lower ferromagnetic layer and the upper ferromagnetic layer.

These and other aspects, implementations and associated advantages are described in greater detail in the drawings, the description and the claims.

BRIEF DESCRIPTION OF THE DRAWINGS

FIG. 8A to FIG. 8D are sectional views illustrating a configuration example of a semiconductor device.

DETAILED DESCRIPTION

Figure 1:
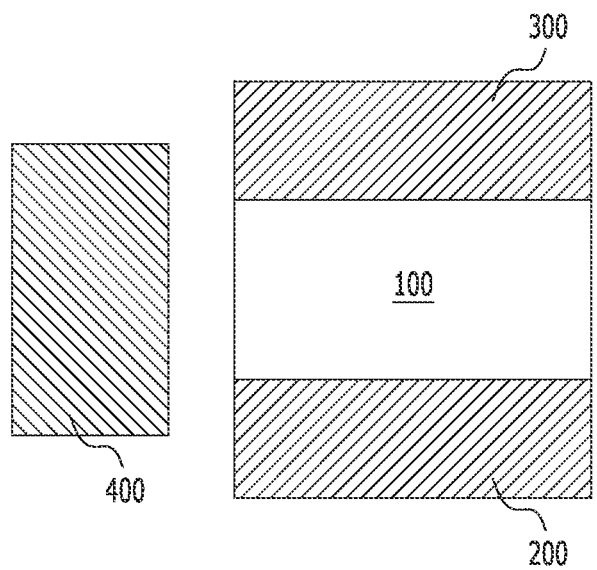
FIG. 1 is a sectional view illustrating a semiconductor device.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a sectional view illustrating a semiconductor device in accordance with a first implementation of the patent document.

Referring to FIG. 1, a semiconductor device may include a first electrode 200, a second electrode 300 spaced apart from the first electrode 200, a resistance variable element 100 interposed between the first electrode 200 and the second electrode 300, and a conductor 400. The conductor 400 is spaced apart from the resistance variable element 100 and applies an electric field to the resistance variable element 100.

The resistance variable element 100 may include a structure in which electrical resistance changes according to a voltage or a current applied to both ends of the resistance variable element 100 and the resistance variable element 100 may be switched between at least two different resistance states. For example, the resistance variable element 100 may include a magnetic tunnel junction (MTJ) structure in which electrical resistance changes by spin transfer torque (STT) or a magnetic field, and may also include a structure in which electrical resistance changes by oxygen vacancy, migration of ions and so on, or a phase change in a substance.

The first electrode 200 and the second electrode 300 may include conductive material capable of applying a voltage or a current to the resistance variable element 100. For example, the first and second electrodes 200 and 300 may include a single layer including metal, such as tantalum (Ta), titanium (Ti), ruthenium (Ru), hafnium (Hf), zirconium (Zr), aluminum (Al), tungsten (W), copper (Cu), gold (Au), silver (Ag), platinum (Pt), nickel (Ni), chrome (Cr), or cobalt (Co), or metal nitride such as titanium nitride (TiN), tantalum nitride (TaN), or tungsten nitride (WN), or a multilayer including a combination thereof.

The conductor 400 applies an electric field to the resistance variable element 100. The conductor 400 may include the same conductive material of the first and second electrodes 200 and 300, and may include a conductive material different from the first and second electrodes 200 and 300 such as doped silicon. Particularly, since an electric field may be generated if a voltage is applied to the conductor 400, no current may flow through the conductor 400. That is, the conductor 400 may be configured as an open circuit other than a closed circuit. The conductor 400 may operate independently from the first and second electrodes 200 and 300, or operate dependently with the first and second electrodes 200 and 300.

Various configurations can be provided for the position and the shape of the conductor 400. The conductor 400 may be variously modified depending on characteristics required or fabricating processes. As one example, the conductor 400 is illustrated in FIG. 1 to be located at the left side of the resistance variable element 100. The conductor 400 can be arranged in any positions including the right side of the resistance variable element 100 so long as an electric field can be applied to the resistance variable element 100. An interval between the conductor 400 and the resistance variable element 100 may change to adjust the intensity of an electric field that is applied to the resistance variable element 100. Further, if the width and the height of the conductor 400 change according to necessity, an interval between the conductor 400 and the resistance variable element 100 can be adjusted. An interval between the first electrode 200 and the conductor 400 may be equal to an interval between the second electrode 300 and the conductor 400. In other implementations, the two intervals may be different from each other.

FIG. 2A to FIG. 2D are sectional views illustrating the resistance variable element 100 in accordance with one implementation of the patent document.

Figure 2A:
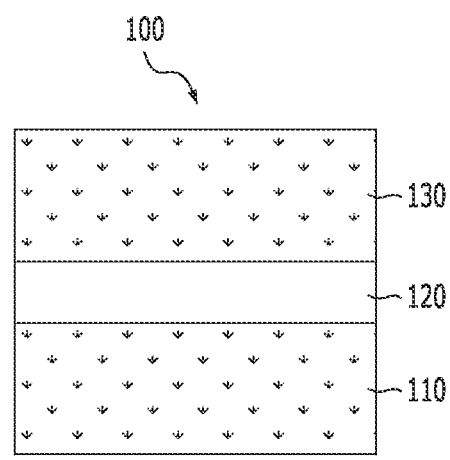
FIG. 2A to FIG. 2D are sectional views illustrating a resistance variable element of FIG. 1.

Referring to FIG. 2A, the resistance variable element 100 may include a first magnetic layer 110, a second magnetic layer 130 spaced apart from the first magnetic layer 110, and a tunnel barrier layer 120 interposed between the first magnetic layer 110 and the second magnetic layer 130. One of the first magnetic layer 110 and the second magnetic layer 130 may be a pinned layer having a pinned magnetization direction, and the other may be a free layer having a variable magnetization direction. The resistance variable element 100 may be in a low resistance state when the magnetization directions of the first and second magnetic layers 110 and 130 are parallel to each other, and in a high resistance state when the magnetization directions of the first and second magnetic layers 110 and 130 are anti-parallel to each other. A seed layer (not shown) serving as a seed for forming the first magnetic layer 110 may be arranged below the first magnetic layer 110, and a capping layer for capping the second magnetic layer 130 (not shown) may be arranged above the second magnetic layer 130.

The first and second magnetic layers 110 and 130 may include ferromagnetic material such as iron (Fe), nickel (Ni), cobalt (Co), gadolinium (Gd), or dysprosium (Dy), or an alloy thereof, for example, cobalt-iron (CoFe), nickel-iron (NiFe), cobalt-iron-nickel (CoFeNi) and so on. In order to improve the material properties of the first and second magnetic layers 110 and 130, various elements may be added to such ferromagnetic material and an alloy thereof. For example, the first and second magnetic layers 110 and 130 may include cobalt-iron-boron (CoFeB) that is obtained by adding boron (B) to cobalt-iron (CoFe). Further, it is possible to add other elements than the boron (B), including one or more of tantalum (Ta), ruthenium (Ru), copper (Cu), gold (Au), titanium (Ti), chrome (Cr), silver (Ag), aluminum (Al), osmium (Os), rhenium (Re), carbon (C), oxygen (O), nitrogen (N), palladium (Pd), platinum (Pt), zirconium (Zr), zinc (Zn), iridium (Ir), tungsten (W), molybdenum (Mo), and niobium (Nb). The first magnetic layer 110 and the second magnetic layer 130 may include the same material or different materials from each other.

The tunnel barrier layer 120 may include non-magnetic insulating material such as magnesium oxide (MgO), aluminum oxide ($Al_2O_3$), silicon oxide ($SiO_2$), bismuth oxide ($Bi_2O_3$), magnesium nitride (MgN), aluminum nitride (AlN), silicon nitride (SiN), magnesium fluoride ($MgF_2$), or calcium fluoride ($CaF_2$). The tunnel barrier layer 120 may have a thickness to cause tunneling magnetoresistance (TMR) to occur. The seed layer and the capping layer may be a single layer including conductive material such as metal or metal nitride, or a multi-layer similar to the first and second electrodes 200 and 300.

Figure 2B:
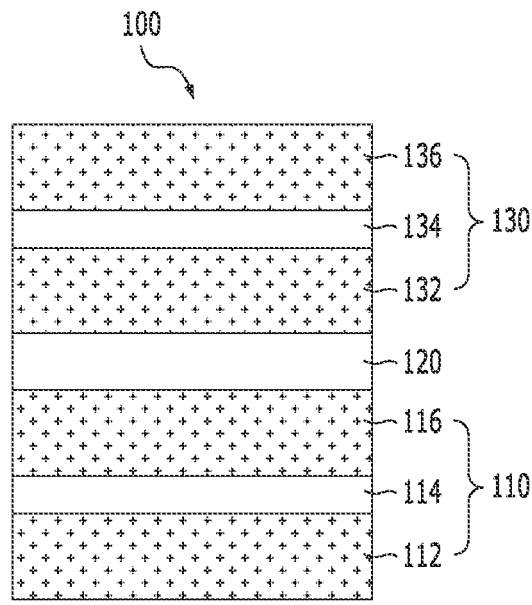

Referring to FIG. 2B, the first magnetic layer 110 of the resistance variable element 100 may be a synthetic anti-ferromagnetic layer (SAF layer) including a lower ferromagnetic layer 112, an upper ferromagnetic layer 116 spaced apart from the lower ferromagnetic layer 112, and a non-magnetic spacer layer 114 interposed between the lower ferromagnetic layer 112 and the upper ferromagnetic layer 116. Similarly, the second magnetic layer 130 may be a synthetic anti-ferromagnetic layer (SAF layer) including a lower ferromagnetic layer 132, an upper ferromagnetic layer 136 spaced apart from the lower ferromagnetic layer 132, and a non-magnetic spacer layer 134 interposed between the lower ferromagnetic layer 132 and the upper ferromagnetic layer 136.

The lower ferromagnetic layers 112 and 132 and the upper ferromagnetic layers 116 and 136 may include the aforementioned ferromagnetic material or an alloy thereof, and may be coupled to each other anti-ferromagnetically or ferromagnetically. The non-magnetic spacer layers 114 and 134 may include ruthenium (Ru), chrome (Cr), copper (Cu), titanium (Ti), tungsten (W), tantalum (Ta) and so on. The thicknesses of the non-magnetic spacer layers 114 and 134 may change, which allows to control exchange coupling characteristics between the lower ferromagnetic layer 112 and the upper ferromagnetic layer 116 and between the lower ferromagnetic layer 132 and the upper ferromagnetic layers 136. In the present implementation, the both of the first and second magnetic layers 110 and 130 are the synthetic anti-ferromagnetic layer (SAF layer). In other implementations, only one of the first and second magnetic layers 110 and 130 may be the synthetic anti-ferromagnetic layer (SAF layer).

Figure 2C:
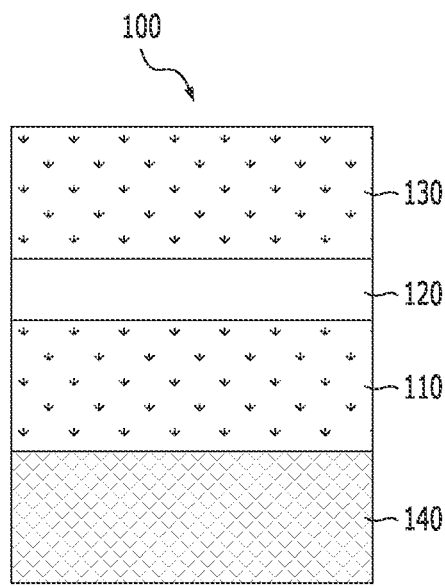

Referring to FIG. 2C, the resistance variable element 100 may include a first magnetic layer 110 having a pinned magnetization direction, a second magnetic layer 130 having a variable magnetization direction, a tunnel barrier layer 120 interposed between the first magnetic layer 110 and the second magnetic layer 130, and an anti-ferromagnetic layer 140 in contact with the first magnetic layer 110.

The anti-ferromagnetic layer 140 may stably pin the magnetization direction of the first magnetic layer 110. the anti-ferromagnetic layer 140 may include anti-ferromagnetic material such as platinum manganese (PtMn), iridium manganese (IrMn), nickel manganese (NiMn), iron manganese (FeMn), nickel oxide (NiO), cobalt oxide (CoO), iron oxide ($Fe_2O_3$), nickel chloride ($NiCl_2$), cobalt chloride ($CoCl_2$), or iron chloride ($FeCl_2$). In the present implementation, since the first magnetic layer 110 corresponds to a pinned layer, the anti-ferromagnetic layer 140 is arranged below the first magnetic layer 110 to be contact with the first magnetic layer 110. In other implementations, if the second magnetic layer 130 is a pinned layer, the anti-ferromagnetic layer 140 may be arranged above the second ferromagnetic layer 130 to be contact with the second magnetic layer.

Figure 2D:
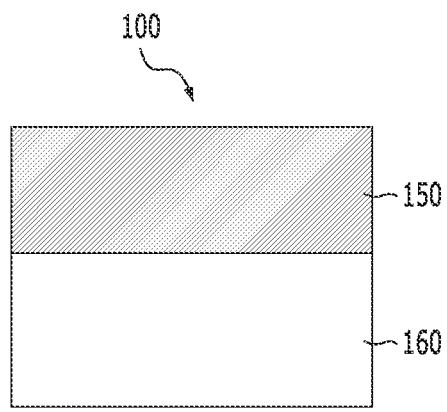

Referring to FIG. 2D, the resistance variable element 100 may include a variable resistance layer 150 and a switching layer 160 electrically connected to the variable resistance layer 150. The variable resistance layer 150 may include phase change material, which enters a crystalline state or an amorphous state by heat and thus its own electrical resistance changes, for example, chalcogenide-based material such as GST in which germanium (Ge), antimony (Sb), and tellurium (Te) are coupled to one another at a predetermined ratio. In addition, the variable resistance layer 150 may include material in which a filament-like current path is generated or removed according to an applied voltage or current and thus its own electrical resistance changes.

The material, in which a current path is generated or removed and thus its own electrical resistance changes, may include perovskite-based material such as STO ($SrTiO_3$), BTO ($BaTiO_3$), or PCMO ($Pr_{1-x}Ca_xMnO_3$), and transition metal oxide (TMO) such as titanium oxide ($TiO_2$), hafnium oxide ($HfO_2$), zirconium oxide ($ZrO_2$), aluminum oxide ($Al_2O_3$), tantalum oxide ($Ta_2O_5$), niobium oxide ($Nb_2O_5$), cobalt oxide ($Co_3O_4$), nickel oxide (NiO), tungsten oxide ($WO_3$), or lanthanum oxide ($La_2O_3$).

The switching layer 160 may include a transistor capable of performing an ON/OFF operation, or a diode in which a current flows only in a single direction. Also, the switching layer 160 may include a metal-insulator transition (MIT) element whose electrical resistance is suddenly changed because the MIT element transits from an insulator to metal or from metal to an insulator at a specific critical temperature by a change in a crystalline structure, an asymmetric tunnel barrier having a non-linear current-voltage characteristic, and an ovonic switching element capable of performing switching at a specific threshold voltage, or another selective element. In the present implementation, the switching layer 160 is in contact with the variable resistance layer 150 through the lower portion of the variable resistance layer 150. However, the switching layer 160 may be in contact with the variable resistance layer 150 through the upper portion of the variable resistance layer 150, or may not be directly in contact with the variable resistance layer 150.

Figure 3:
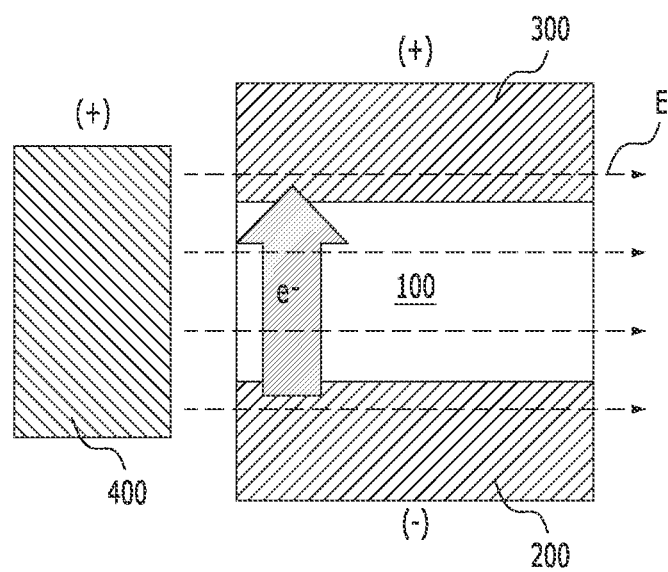
FIG. 3 is a sectional view for explaining an operation method of a semiconductor device.

FIG. 3 is a sectional view for explaining an operation method of the semiconductor device in accordance with the first implementation of the patent document.

Referring to FIG. 3, when a negative (−) voltage is applied to the first electrode 200 of the semiconductor device and a positive (+) voltage is applied to the second electrode 300 thereof, electrons (e−) may move in a direction from the first electrode 200 to the second electrode 300. At this time, since the direction of a current is opposite to the movement direction of the electrons, the current may flow from the top to the bottom of the resistance variable element 100. In other implementations, various configurations can be applied to the polarity and the magnitude of a voltage applied to the first and second electrodes 200 and 300. For example, the positive (+) voltage may be applied to the first electrode 200 and the negative (−) voltage may be applied to the second electrode 300, thereby providing the current flowing from the bottom to the top of the resistance variable element 100.

When no voltage is applied to the conductor 400 arranged at the left side of the resistance variable element 100, a current flows through an entire area of the resistance variable element 100. In such a case, a large amount of current is required to switch between different resistance states of the resistance variable element 100, i.e., from a high resistance state to a low resistance state or from a low resistance state to a high resistance state. If voltage is applied to the conductor 400, a current may flow through only part of the entire area of the resistance variable element 100 and thus can have a higher current density. For example, when the positive (+) voltage is applied to the conductor 400, an electric field (E) may be generated, which has a direction from the left side to the right side of the resistance variable element 100. At this time, electric attraction may occur in a direction opposite to the electric field (E) direction (refer to dotted arrows), and thus a current may flow only in the left inside the resistance variable element 100. In an example of FIG. 3, the movement directions of the electrons (e−) are indicated by a thick arrow in the left inside the resistance variable element 100. However, other implementations are possible. For example, the electrons (e−) may move from the second electrode 300 to the first electrode 200. When the negative (−) voltage is applied to the conductor 400, the direction of the electric field (E) is reversed, and thus, the current may flow only in a right inside the resistance variable element 100.

As described above, when the current flows only in a part of the resistance variable element 100, the reduced spatial spread of the current allows a higher current density to be achieved and accordingly, an amount of current used for the switching operation of the resistance variable element 100 is reduced. Since the conductor 400 of the semiconductor device may operate independently from the first and second electrodes 200 and 300, a different voltage from the voltage applied to the first and second electrodes 200 and 300 may be applied to the conductor 400. If a voltage applied to the conductor 400 is greater, a strong electric field (E) may be generated. Consequently, a switching current of the resistance variable element 100 may be further reduced. The electric field (E) may be generated in a direction crossing the direction of the current flowing through the resistance variable element 100, for example, in a direction perpendicular to the direction of the current flowing through the resistance variable element 100.

Figure 4:
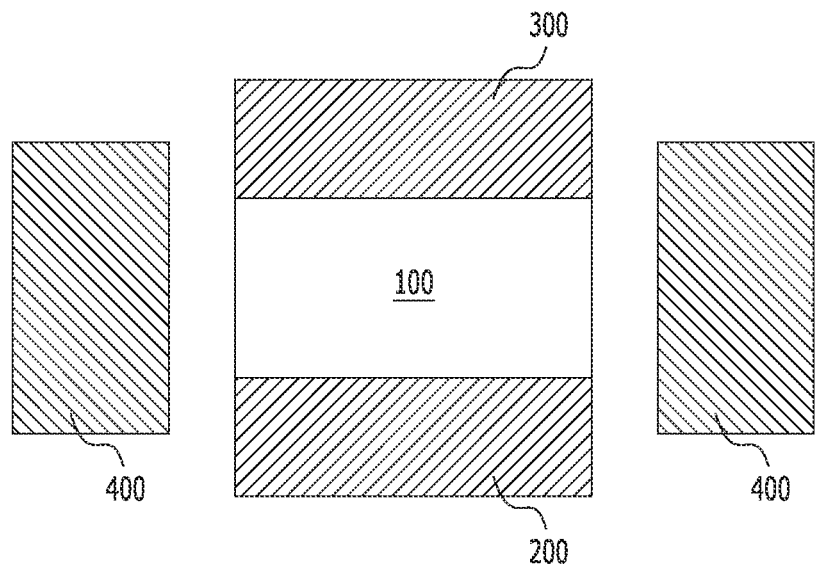
FIG. 4 is a sectional view illustrating a semiconductor device.

FIG. 4 is a sectional view illustrating a semiconductor device in accordance with a second implementation of the patent document.

Referring to FIG. 4, the semiconductor device may include a first electrode 200, a second electrode 300 spaced apart from the first electrode 200, a resistance variable element 100 interposed between the first electrode 200 and the second electrode 300, and a pair of conductors 400. The pair of conductors 400 may be symmetrically arranged at the opposite sides of the resistance variable element 100.

The conductors 400 may apply an electric field to the resistance variable element 100, and may include conductive material same as the first and second electrodes 200 and 300 and may also include different conductive materials such as doped silicon. In the case of forming the conductor 400 by doping impurities on single crystalline or multi-crystalline silicon, tensile stress or compressive stress may be applied to the resistance variable element 100 by lattice mismatch and the like. Such stress improves magnetic anisotropy of the magnetic tunnel junction (MTJ) structure included in the resistance variable element 100 or the migration of oxygen vacancy, ions and so on, which improves the characteristics of the resistance variable element 100.

Figure 5:
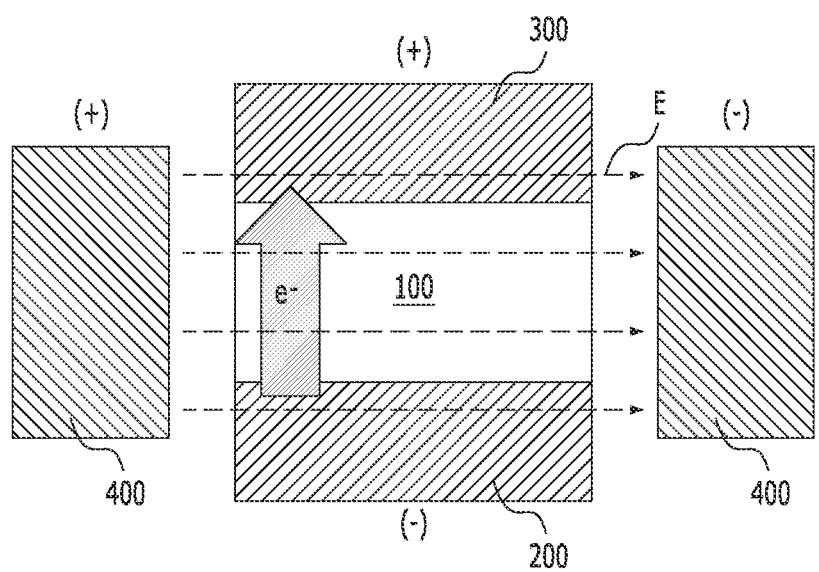
FIG. 5 is a sectional view for explaining an operation method of a semiconductor device.

FIG. 5 is a sectional view for explaining an operation method of the semiconductor device.

Referring to FIG. 5, when a negative (−) voltage is applied to the first electrode 200 of the semiconductor device and a positive (+) voltage is applied to the second electrode 300 thereof, electrons (e−) may move in a direction from the first electrode 200 to the second electrode 300. At this time, since the direction of a current is opposite to the movement direction of the electrons, the current may flow from the top to the bottom of the resistance variable element 100. In other implementations, various changes can be made for the polarity and the magnitude of a voltage applied to the first and second electrodes 200 and 300.

The conductors 400 may operate independently from each other. When different voltages are applied to the respective conductors 400, an electric field (E) passing through the resistance variable element 100 may be generated. For example, when a positive (+) voltage is applied to the conductor 400 arranged at the left side of the resistance variable element 100 and a negative (−) voltage is applied to the conductor 400 arranged at the right side thereof, an electric field (E) may be generated in a direction from the left to the right of the resistance variable element 100. At this time, electronic attraction may occur in a direction opposite to the direction of the electric field (E), and thus a current may flow only in a left inside the resistance variable element 100. When the negative (−) voltage is applied to the conductor 400 arranged at the left side of the resistance variable element 100 and the positive (+) voltage is applied to the conductor 400 arranged at the right side thereof, the direction of the electric field (E) is reversed, and thus, the current may flow only in a right inside the resistance variable element 100.

In other implementations, various changes can be made for the polarity and the magnitude of a voltage applied to the pair of conductors 400. If the difference between a voltage applied to one of the conductors 400 and a voltage applied to the other of the conductors 400 is large, a strong electric field (E) may be generated. Since the pair of the conductors 400 of the semiconductor device are arranged at opposite sides of the resistance variable element 100, the intensity of the electric field (E) is increased. Thus, it is possible to significantly reduce a switching current of the resistance variable element 100.

Figure 6A:
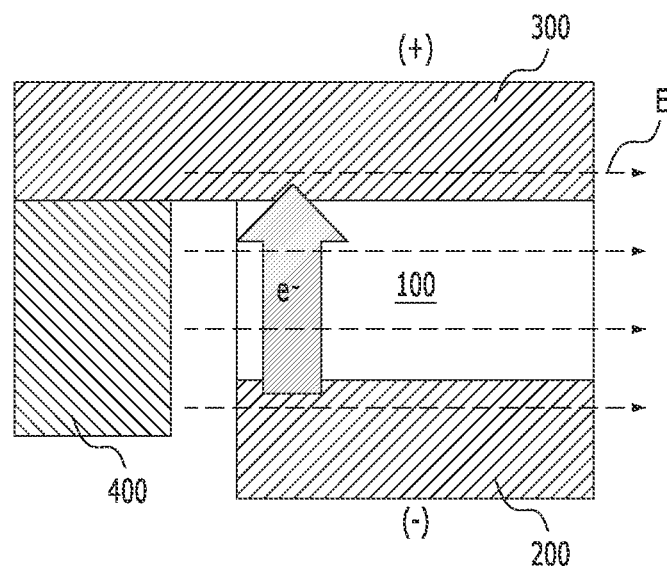
FIG. 6A and FIG. 6B are sectional views for explaining a semiconductor device and an operation method thereof.
Figure 6B:
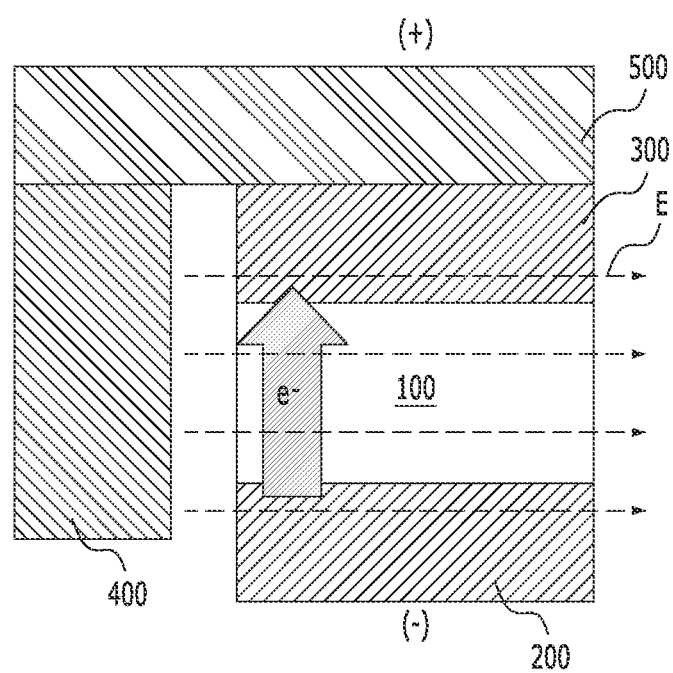

FIG. 6A and FIG. 6B are sectional views for explaining a semiconductor device and an operation method thereof in accordance with a third implementation of the patent document.

Referring to FIG. 6A and FIG. 6B, the semiconductor device may include a first electrode 200, a second electrode 300 spaced apart from the first electrode 200, a resistance variable element 100 interposed between the first electrode 200 and the second electrode 300, and a conductor 400 spaced apart from the resistance variable element 100. The conductor 400 may apply an electric field to the resistance variable element 100, while the conductor 400 may be electrically connected to the second electrode 300.

The conductor 400 may be directly connected to the second electrode 300 as shown in FIG. 6A or may be indirectly connected to the second electrode 300 through an interconnection 500 as shown in FIG. 6B. Various configurations can be provided for an indirect connection between the conductor and the second electrode 300. In the present implementation, since the conductor 400 is electrically connected to the second electrode 300, the same voltage is applied to the second electrode 300 and the conductor 400. Thus, a separate circuit configuration for providing a voltage to the conductor 400 is not necessary. Thus, it is possible to simplify fabricating processes and reduce fabrication costs. In other implementations, the conductor 400 may be electrically connected to the first electrode 200 instead of the second electrode 300 so that the conductor 400 and the first electrode 200 operate dependently of each other.

Figure 7A:
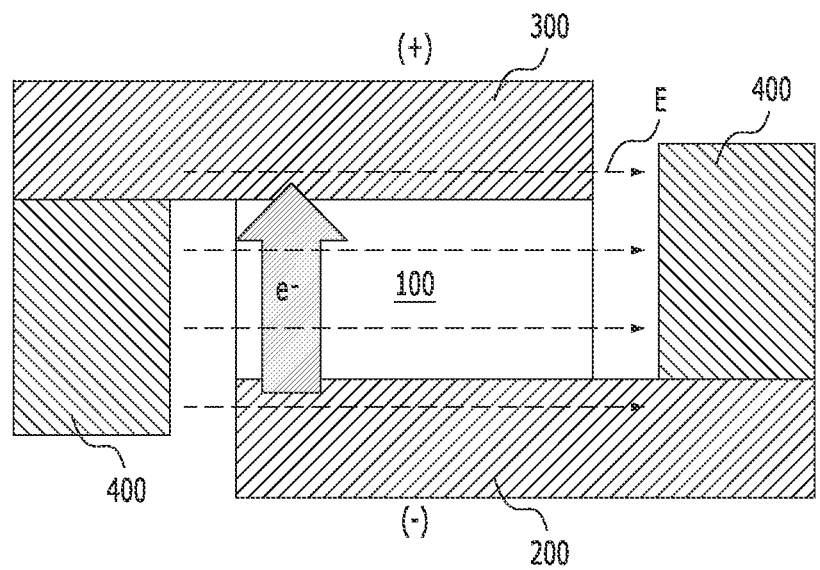
FIG. 7A and FIG. 7B are sectional views for explaining a semiconductor device and an operation method thereof.
Figure 7B:
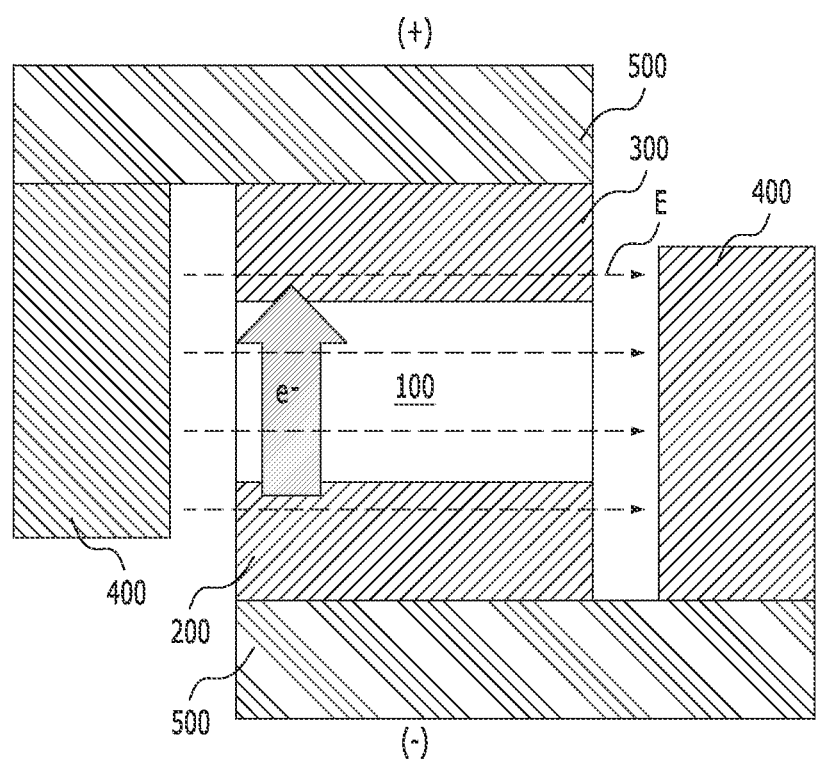

FIG. 7A and FIG. 7B are sectional views for explaining a semiconductor device and an operation method thereof.

Referring to FIG. 7A and FIG. 7B, the semiconductor device may include a first electrode 200, a second electrode 300 spaced apart from the first electrode 200, a resistance variable element 100 interposed between the first electrode 200 and the second electrode 300, and a pair of conductors 400 symmetrically arranged at the opposite sides of the resistance variable element 100. The conductors 400 may apply an electric field to the resistance variable element 100, while one of the conductors 400 may be electrically connected to the first electrode 200 and the other may be electrically connected to the second electrode 300.

The respective conductors 400 may be directly connected to the first electrode 200 or the second electrode 300 as shown in FIG. 7A, or may be indirectly connected to the first electrode 200 or the second electrode 300 through an interconnection 500 as shown in FIG. 7B. Various configurations can be provided for an indirect connection between the conductors 400 and the first electrode 200 or the second electrodes 300. In the present implementation, since the conductors 400 is electrically connected to the first electrode 200 or the second electrode 300, the same voltage is applied to the first electrode 200 and one of the conductors 400 electrically connected with the first electrode 200, and the same voltage is applied to the second electrode 300 and the other of the conductors 400 electrically connected with the second electrode. Thus, a separate circuit configuration for applying a voltage to the conductors 400 is not necessary, and simplifying fabricating processes and reducing fabrication costs.

FIG. 8A to FIG. 8D are sectional views illustrating a configuration example of a semiconductor device in accordance with one implementation of the patent document.

Referring to FIG. 8A, the semiconductor device includes a first electrode 200, a second electrode 300 spaced apart from the first electrode 200, a resistance variable element 100 interposed between the first electrode 200 and the second electrode 300, and conductors 400 arranged at one or more of one side and the other side of the resistance variable element 100. The conductors 400 may apply an electric field to the resistance variable element 100. The first electrode 200 may be electrically connected to a transistor and the second electrode 300 may be connected to a bit line 660.

The transistor is used as a switch that performs an ON/OFF operation, and may include a NMOS transistor (N-channel Metal Oxide Semiconductor) or a PMOS transistor (P-channel Metal Oxide Semiconductor). Such a transistor may include a gate electrode 610 formed on a substrate 600, and a source region 620S and a drain region 620D formed in the substrate 600 at opposite sides of the gate electrode 610, wherein a gate insulating layer (not illustrated) may be interposed between the substrate 600 and the gate electrode 610. The source region 620S may be connected to a source line 650 through a contact plug 630 and so on, and the drain region 620D may be connected to the first electrode 200 through a contact plug 640 and so on.

The substrate 600 may include a silicon (Si) substrate, a germanium (Ge) substrate, a silicon-germanium (SiGe) substrate, or a SOI (Silicon-On-Insulator) substrate, and the source region 620S and the drain region 620D may be formed by injecting impurities into the substrate 600 through an ion implantation process and so on. The gate electrode 610, the contact plugs 630 and 640, the source line 650, and the bit line 660 may include conductive material such as metal, metal nitride, or doped silicon.

Figure 8B:
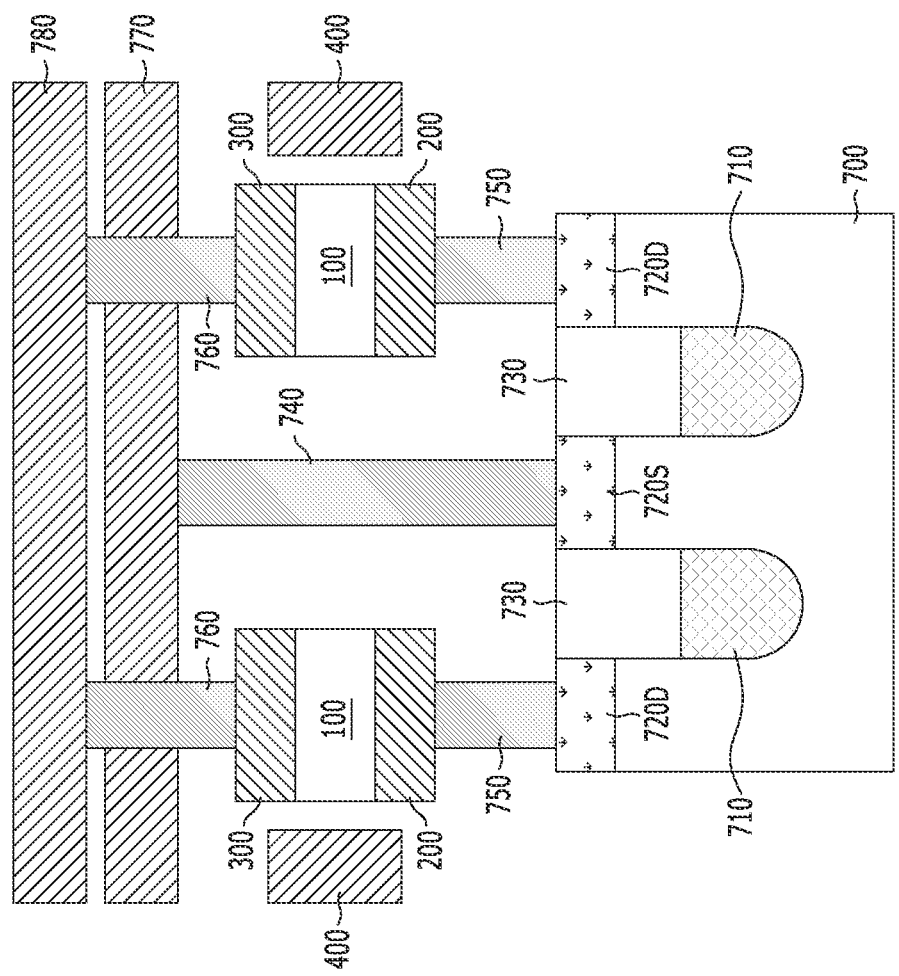

Referring to FIG. 8B, the first electrode 200 of the semiconductor device may be electrically connected to a transistor having a gate electrode 710 buried in a substrate 700, and the second electrode 300 may be connected to a bit line 780 through a contact plug 760 and so on. A capping layer 730 may be formed on the gate electrode 710, and a source region 720S and a drain region 720D doped with impurities may be formed in the substrate 700 at opposite sides of the capping layer 730. The source region 720S may be connected to a source line 770 through a contact plug 740 and so on, and the drain region 720D may be connected to the first electrode 200 through a contact plug 750 and so on.

The substrate 700 may include a semiconductor substrate including silicon, germanium and so on, and a gate insulating layer (not illustrated) may be interposed between the substrate 700 and the gate electrode 710. The capping layer 730 may include oxide or nitride-based material, and the gate electrode 710, the contact plugs 740, 750, and 760, the source line 770, and the bit line 780 may include the aforementioned conductive material.

Referring to FIG. 8C, the first electrode 200 of the semiconductor device may be electrically connected to a transistor having a vertical channel layer 800, and the second electrode 300 may be connected to a bit line 830 through a contact plug 820 and so on. A gate electrode 810 may be in contact with at least a part of a side of the channel layer 800, and a gate insulating layer (not illustrated) may be interposed between the channel layer 800 and the gate electrode 810. An upper end of the channel layer 800 may be connected to the first electrode 200 and a lower end of the channel layer 800 may be connected to a source line 840.

The channel layer 800 may include semiconductor material such as silicon or germanium, and a junction region (not illustrated) doped with impurities may be formed at the upper end and the lower end of the channel layer 800. The gate electrode 810, the contact plug 820, the bit line 830, and the source line 840 may include the aforementioned conductive material.

Figure 8D:
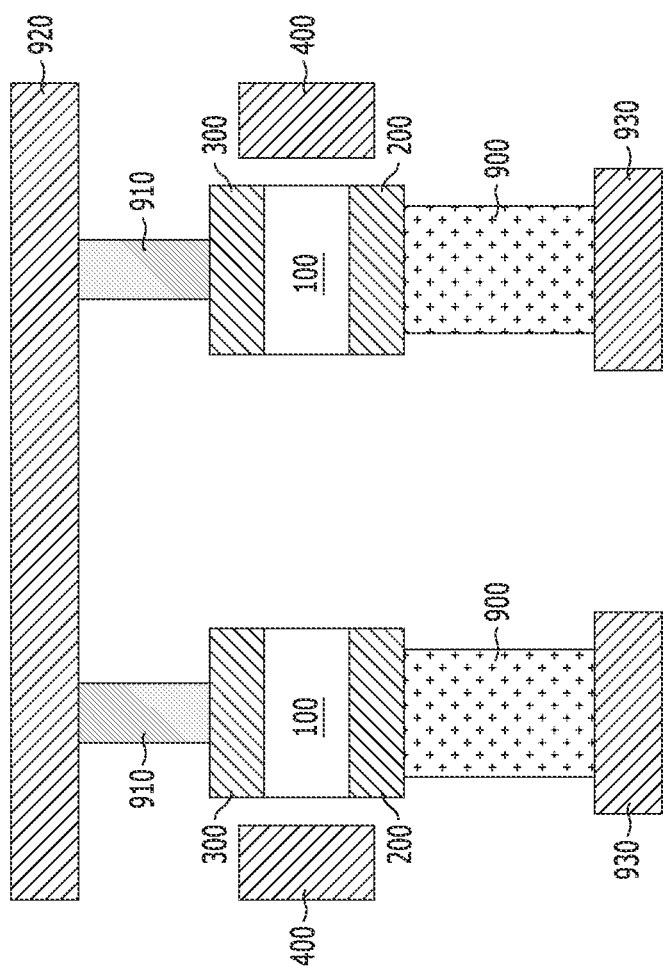

Referring to FIG. 8D, the first electrode 200 of the semiconductor device may be electrically connected to one end of a selective element 900, and the second electrode 300 may be connected to a bit line 920 through a contact plug 910 and so on. The other end of the selective element 900 may be connected to a word line 930, and the bit line 920 and the word line 930 may extend in a direction in which they cross each other.

The selective element 900 may include a diode such as a Schottky diode, a PN diode, a PIN diode, or a MIM diode, and may also include an asymmetric tunnel barrier, a metal-insulator transition (MIT) element, an ovonic switching element and so on. The gate contact plug 910, the bit line 920, and the word line 930 may include the aforementioned conductive material.

The above and other memory circuits or semiconductor devices based on the disclosed technology can be used in a range of devices or systems. FIGS. 9-13 provide some examples of devices or systems that can implement the memory circuits disclosed herein.

Figure 9:
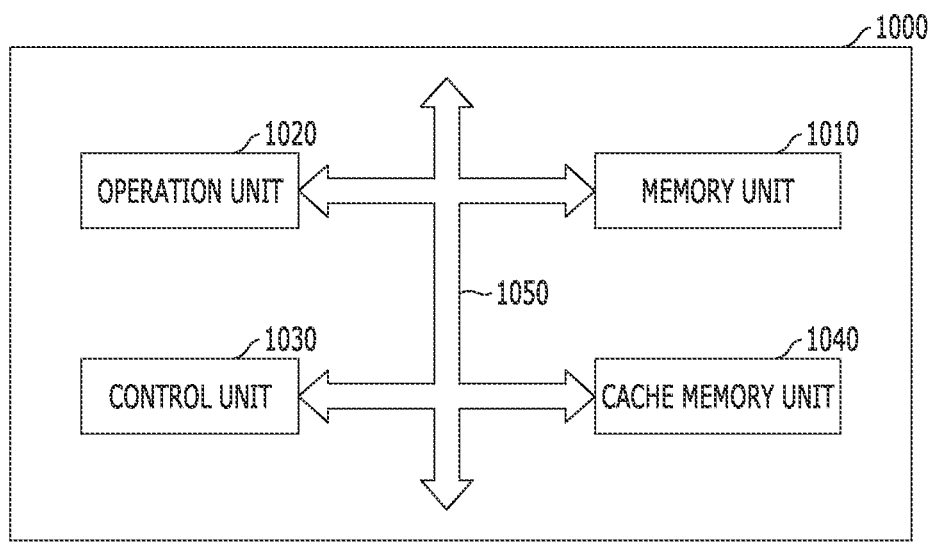
FIG. 9 is an example of configuration diagram of a microprocessor implementing memory circuitry based on the disclosed technology.

FIG. 9 is an example of configuration diagram of a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first electrode; a second electrode spaced apart from the first electrode; a resistance variable element interposed between the first electrode and the second electrode; and a conductor arranged adjacent to the resistance variable element and providing an electric field to the resistance variable element. Through this, in the memory unit 1010, the electric field is applied to the resistance variable element through the conductor adjacent to the resistance variable element, which allows a current to flow in a local area inside the resistance variable element. Thus, a switching current of the resistance variable element can be reduced, thereby saving power consumption of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
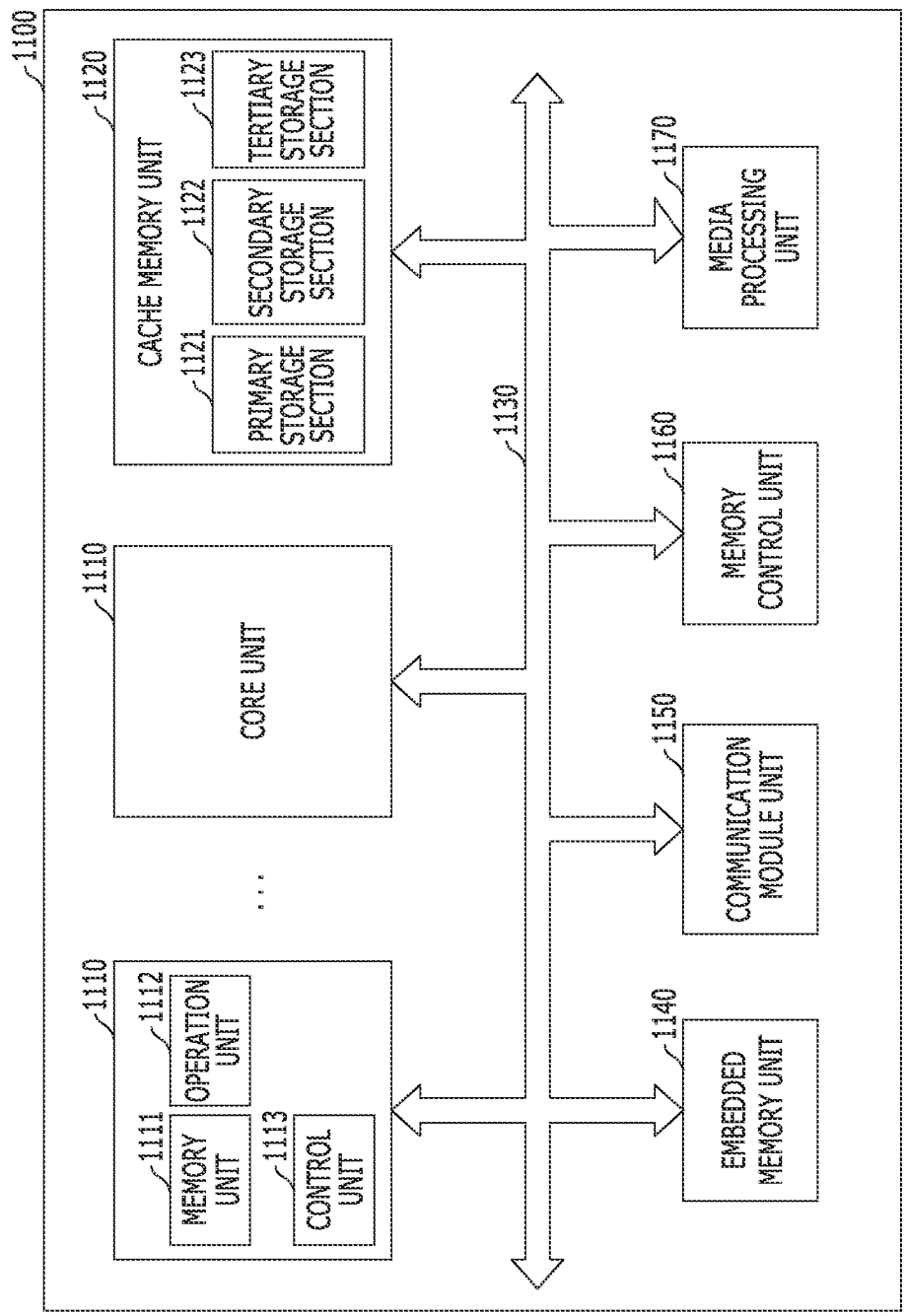
FIG. 10 is an example of configuration diagram of a processor implementing memory circuitry based on the disclosed technology.

FIG. 10 is an example of configuration diagram of a processor implementing memory circuitry based on the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first electrode; a second electrode spaced apart from the first electrode; a resistance variable element interposed between the first electrode and the second electrode; and a conductor arranged adjacent to the resistance variable element and providing an electric field to the resistance variable element. Through this, in the cache memory unit 1120, the electric field is applied to the resistance variable element through the conductor adjacent to the resistance variable element, which allows a current to flow in a local area inside the resistance variable element. Thus, a switching current of the resistance variable element can be reduced, thereby saving power consumption of the processor 1100.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
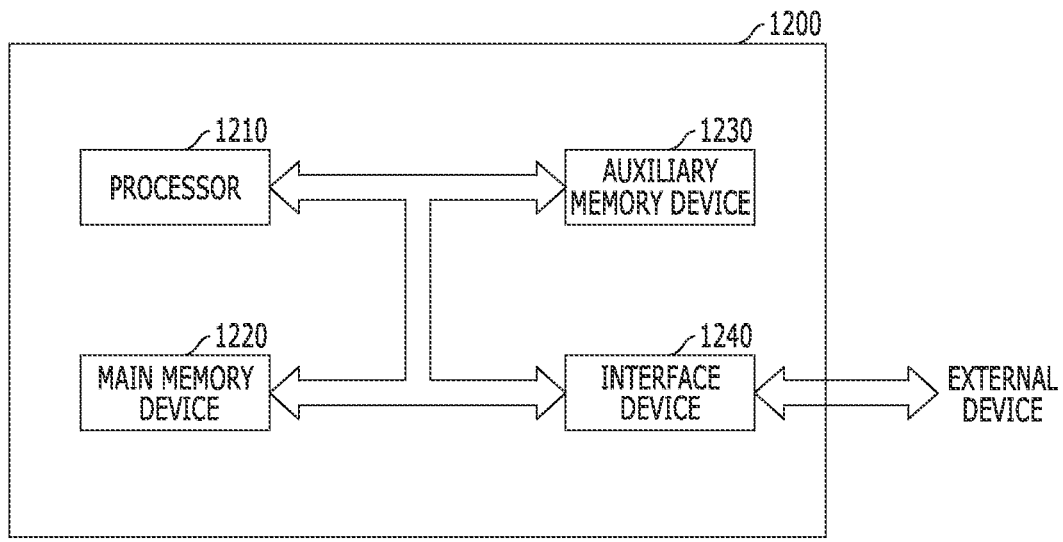
FIG. 11 is an example of configuration diagram of a system implementing memory circuitry based on the disclosed technology.

FIG. 11 is an example of configuration diagram of a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first electrode; a second electrode spaced apart from the first electrode; a resistance variable element interposed between the first electrode and the second electrode; and a conductor arranged adjacent to the resistance variable element and providing an electric field to the resistance variable element. Through this, in the main memory device 1220, the electric field is applied to the resistance variable element through the conductor adjacent to the resistance variable element, which allows a current to flow in a local area inside the resistance variable element. Thus, a switching current of the resistance variable element is reduced thereby saving power consumption of the system 1200.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first electrode; a second electrode spaced apart from the first electrode; a resistance variable element interposed between the first electrode and the second electrode; and a conductor arranged adjacent to the resistance variable element and providing an electric field to the resistance variable element. Through this, in the auxiliary memory device 1230, the electric field is applied to the resistance variable element through the conductor adjacent to the resistance variable element, which allows a current to flow in a local area inside the resistance variable element. Thus, a switching current of the resistance variable element is reduced thereby saving power consumption of the system 1200.

Also, the auxiliary memory device 1230 may further include a data storage system (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
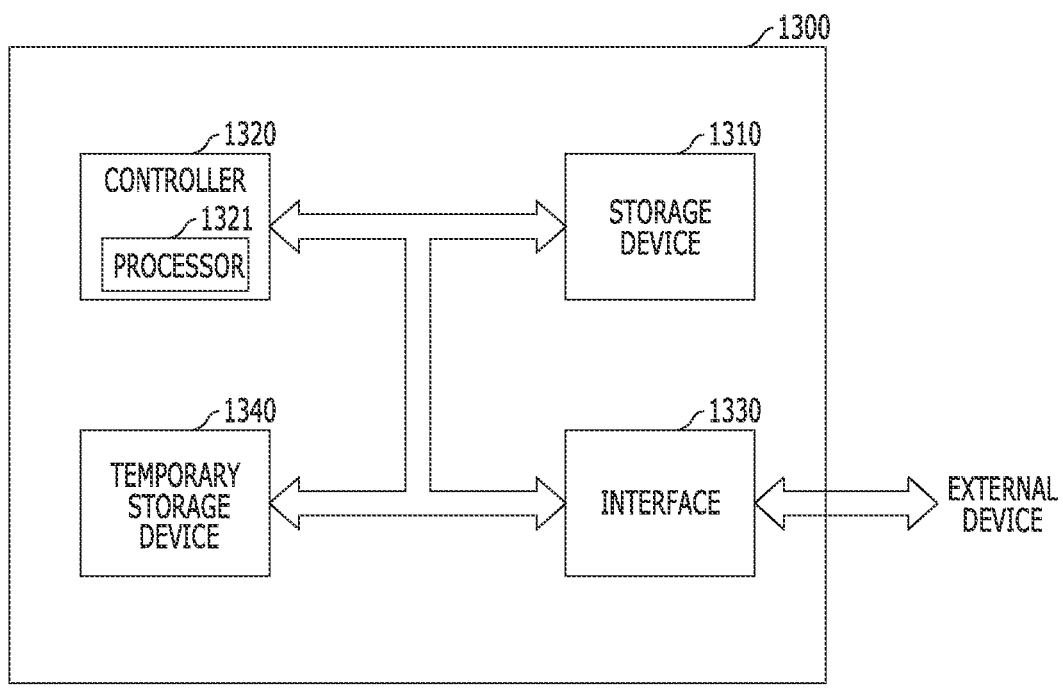
FIG. 12 is an example of configuration diagram of a data storage system implementing memory circuitry based on the disclosed technology.

FIG. 12 is an example of configuration diagram of a data storage system implementing memory circuitry based on the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first electrode; a second electrode spaced apart from the first electrode; a resistance variable element interposed between the first electrode and the second electrode; and a conductor arranged adjacent to the resistance variable element and providing an electric field to the resistance variable element. Through this, in the temporary storage device 1340, the electric field is applied to the resistance variable element through the conductor adjacent to the resistance variable element, which allows a current to flow in a local area inside the resistance variable element. Thus, a switching current of the resistance variable element can be reduced thereby saving power consumption of the data storage system 1300.

Figure 13:
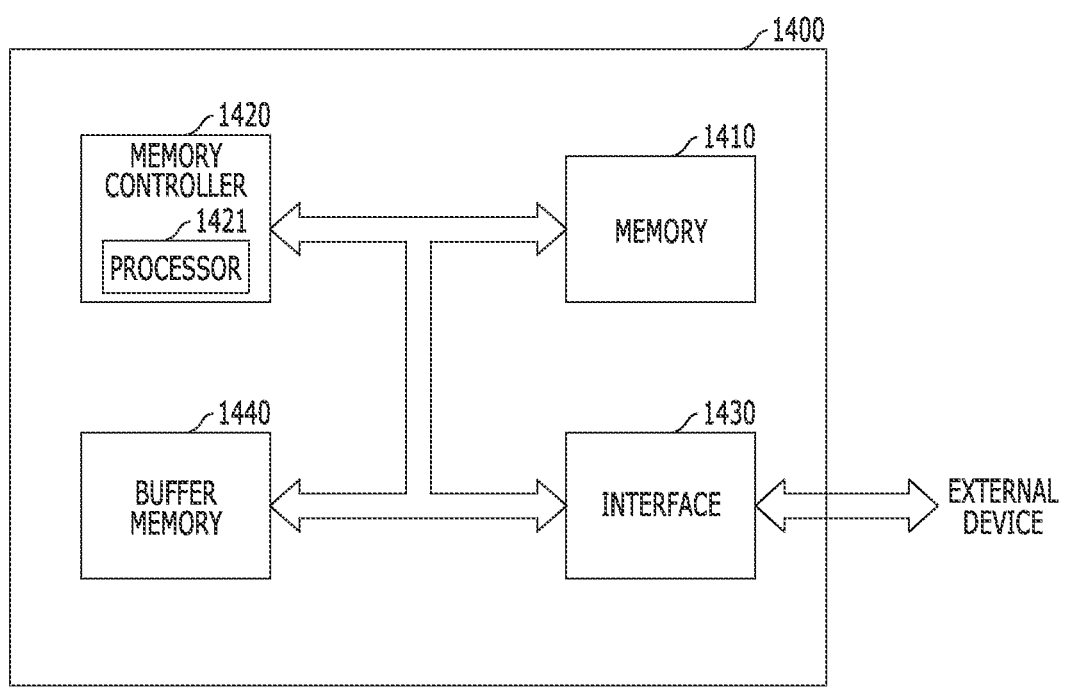
FIG. 13 is an example of configuration diagram of a memory system implementing memory circuitry based on the disclosed technology.

FIG. 13 is an example of configuration diagram of a memory system implementing memory circuitry based on the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first electrode; a second electrode spaced apart from the first electrode; a resistance variable element interposed between the first electrode and the second electrode; and a conductor arranged adjacent to the resistance variable element and providing an electric field to the resistance variable element. Through this, in the memory 1410, the electric field is applied to the resistance variable element through the conductor adjacent to the resistance variable element, which allows a current to flow in a local area inside the resistance variable element. Thus, a switching current of the resistance variable element is reduced, thereby saving power consumption of the memory system 1400.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first electrode; a second electrode spaced apart from the first electrode; a resistance variable element interposed between the first electrode and the second electrode; and a conductor arranged adjacent to the resistance variable element and providing an electric field to the resistance variable element. Through this, in the buffer memory 1440, the electric field is applied to the resistance variable element through the conductor adjacent to the resistance variable element, which allows a current to flow in a local area inside the resistance variable element. Thus, a switching current of the resistance variable element can be reduced, thereby saving power consumption of the memory system 1400.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, wherein the semiconductor memory comprises:
    a first electrode;
    a second electrode spaced apart from the first electrode;
    a resistance variable element interposed between the first electrode and the second electrode, and allowing a current flow according to a voltage or current applied to the first and second electrodes; and
    a conductor arranged at a first side of the resistance variable element and providing an electric field to the resistance variable element,
    wherein the current flow has a first direction from the first electrode to the second electrode or from the second electrode to the first electrode, and the electric field has a second direction from the first side to a second side of the resistance variable element which is opposite to the first side so that the current flow is partially formed inside the resistance variable element to be adjacent to the first side or the second side.

2. The electronic device of claim 1, wherein the conductor is electrically connected to the first or second electrode.

3. The electronic device of claim 1, wherein a voltage applied to the conductor is equal to a voltage applied to the first or second electrode.

4. The electronic device of claim 1, wherein the conductor includes one or more of metal, metal nitride, and doped silicon.

5. The electronic device of claim 1, wherein the resistance variable element comprises:
    a first magnetic layer;
    a second magnetic layer spaced apart from the first magnetic layer;
    a tunnel barrier layer formed between the first magnetic layer and the second magnetic layer.

6. The electronic device of claim 5, wherein the first or second magnetic layer comprises:
    a lower ferromagnetic layer;
    an upper ferromagnetic layer spaced apart from the lower ferromagnetic layer; and
    a non-magnetic spacer layer formed between the lower ferromagnetic layer and the upper ferromagnetic layer.

7. The electronic device of claim 5, further comprising:
    an anti-ferromagnetic layer in contact with the first or second magnetic layer.

8. The electronic device of claim 1, wherein the resistance variable element includes a resistance variable layer and a switching layer.

9. The electronic device of claim 8, wherein the resistance variable layer includes metal oxide or phase change material.

10. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory that includes the resistance variable element is part of the memory unit in the microprocessor.

11. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory that includes the resistance variable element is part of the cache memory unit in the processor.

12. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside,
    wherein the semiconductor memory that includes the resistance variable element is part of the auxiliary memory device or the main memory device in the processing system.

13. The electronic device according to claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and
    an interface configured to perform communication between at least one of the storage device, the controller and the temporary storage device and the outside, wherein the semiconductor memory that includes the resistance variable element is part of the storage device or the temporary storage device in the data storage system.

14. An electronic device including a semiconductor memory, wherein the semiconductor memory comprises:
   a first electrode;
   a second electrode;
   a resistance variable element interposed between the first electrode and the second electrode, and allowing a current flow according to a voltage or current applied to the first and second electrodes; and
   a pair of conductors arranged at a first side of the resistance variable element and a second side of the resistance variable element which is opposite to the first side, respectively, and providing an electric field to the resistance variable element,
   wherein the current flow has a first direction from the first electrode to the second electrode or from the second electrode to the first electrode, and the electric field has a second direction from the first side to the second side so that the current flow is partially formed inside the resistance variable element to be adjacent to the first side or the second side.

15. The electronic device of claim 14, wherein the pair of conductors operate independently from each other.

16. The electronic device of claim 14, wherein different voltage is applied to each of the pair of conductors.

17. The electronic device of claim 14, wherein the pair of conductors are electrically connected to the first electrode and the second electrode, respectively.

18. The electronic device of claim 14, wherein the pair of conductors apply tensile stress or compressive stress to the resistance variable element.

19. The electronic device according to claim 14, wherein a direction of the electric field provided by one of the pair of conductors is same as a direction of the electric field provided by the other of the pair of conductors.

* * * * *